(12) United States Patent
Chakrabarti et al.

(10) Patent No.: US 9,614,541 B2
(45) Date of Patent: Apr. 4, 2017

(54) WIRELESS-TRANSMITTER CIRCUITS INCLUDING POWER DIGITAL-TO-AMPLITUDE CONVERTERS

(71) Applicants: Anandaroop Chakrabarti, New York, NY (US); Harish Krishnaswamy, New York, NY (US)

(72) Inventors: Anandaroop Chakrabarti, New York, NY (US); Harish Krishnaswamy, New York, NY (US)

(73) Assignee: The Trustees of Columbia University in the City of New York, New York, NY (US)

( * ) Notice: Subject to any disclaimer, the term of this patent is extended or adjusted under 35 U.S.C. 154(b) by 0 days.

(21) Appl. No.: 14/873,177

(22) Filed: Oct. 1, 2015

(65) Prior Publication Data
US 2016/0099820 A1 Apr. 7, 2016

Related U.S. Application Data

(60) Provisional application No. 62/058,603, filed on Oct. 1, 2014.

(51) Int. Cl.
*H03M 1/66* (2006.01)
*H03M 1/78* (2006.01)
(Continued)

(52) U.S. Cl.
CPC .............. *H03M 1/66* (2013.01); *H03G 3/001* (2013.01); *H03M 1/745* (2013.01); *H03M 1/78* (2013.01);
(Continued)

(58) Field of Classification Search
CPC ........ H03M 1/687; H03M 1/745; H03M 1/66; H03M 1/78; H03M 1/742; H03G 3/007;
(Continued)

(56) References Cited

U.S. PATENT DOCUMENTS 8,620,234 B2   12/2013  Yang et al.
9,118,288 B2 *  8/2015  Lai ........................ H03F 3/2176
(Continued)

OTHER PUBLICATIONS

Chowdhury et al., "A Fully-Integrated Efficient CMOS Inverse Class-D Power Amplifier for Digital Polar Transmitters," in Solid-State Circuits, IEEE Journal of, vol. 47, No. 5, pp. 1113-1122, May 2012.*

(Continued)

*Primary Examiner* — Michelle M Koeth
(74) *Attorney, Agent, or Firm* — Byrne Poh LLP (57) ABSTRACT

Circuits comprising: digital-to-amplitude converter (DAC), comprising: binary weighted switching transistors (BWSTs), each having gate coupled to amplitude control bit ACB, and wherein the drain of each of the BWSTs are connected together and wherein the source of each of the BWSTs are connected together; transistor M1 having gate coupled to input signal and first bias voltage BV1 and source coupled to the drains of the BWSTs; transistor M2 having gate coupled to BV2 and source coupled to the drain of M1; transistor M3 having gate coupled to BV3 and source coupled to the drain of M2; transistor having gate coupled to BV4, source coupled to the drain of M3; and inverter having input coupled to another ACB and having output coupled to the output of the DAC and the drain of M4.

14 Claims, 10 Drawing Sheets

(51) Int. Cl.
| | |
|---|---|
| H04L 27/00 | (2006.01) |
| H03M 1/74 | (2006.01) |
| H03G 3/00 | (2006.01) |
| H03G 3/30 | (2006.01) |
| H04L 25/03 | (2006.01) |

(52) U.S. Cl.
CPC ........... *H04L 27/00* (2013.01); *H03G 3/3036* (2013.01); *H04L 25/03878* (2013.01)

(58) Field of Classification Search
CPC ........ H03G 3/30; H03G 3/001; H03G 3/3036; H04L 25/03878
See application file for complete search history.

(56) References Cited

U.S. PATENT DOCUMENTS

| | | | |
|---|---|---|---|
| 2008/0036486 A1* | 2/2008 | Gattiker | G01R 31/2879 324/762.09 |
| 2010/0060353 A1 | 3/2010 | Grebennikov et al. | |
| 2013/0293308 A1 | 11/2013 | Gupta | |
| 2013/0335147 A1 | 12/2013 | Ma et al. | |

OTHER PUBLICATIONS

Shopov et al., "A 19 dBm, 15 Gbaud, 9 bit SOI CMOS Power-DAC Cell for High-Order QAM W-Band Transmitters," in Solid-State Circuits, IEEE Journal of , vol. 49, No. 7, pp. 1653-1664, Jul. 2014.*
Acar, M. et al., "Analytical Design Equations for Class-E Power Amplifiers with Finite DC-Feed Inductance and Switch On-Resistance", In Proceedings of the International Symposium on Circuits and Systems (ISCAS '07), New Orleans, LA, US, May 27-30, 2007, pp. 2818-2821.
Acar, M., "Generalized Analytical Design Equations for Variable Slope Class-E Power Amplifiers", In Proceedings of the International Conference on Electronics, Circuits, and Systems (ICECS '06), Nice-Acropolis, FR, Dec. 10-13, 2006, pp. 431-434.
Afshari, E. et al., "Electrical Funnel: A Broadband Signal Combining Method", In Proceedings of 2006 IEEE ISSCC, San Francisco, CA, US, Feb. 6-9, 2006, pp. 751-760.
Agah, A. et al., "A 34% PAE, 18.6dBm 42-45GHz Stacked Power Amplifier in 45nm SOI CMOS", In IEEE Radio Frequency Integrated Circuits Symposium (RFIC 12), Montreal, QC, CA, Jun. 17-19, 2012, pp. 57-60.
Agah, A. et al., "A 42 to 47-GHz, 8-Bit I/Q Digital-to-RF Converter with 21-dBm PSAT and 16CMOS", In Proceedings of IEEE Radio Frequency Integrated Circuits Symposium, Honolulu, HI, US, Jun. 2-4, 2013, pp. 249-252.
Agah, A. et al., "A 45GHz Doherty Power Amplifier with 23% PAE and 18dBm Output Power, in 45nm SOI CMOS", In IEEE International Microwave Symposium Digest, Montreal, QC, CA, Jun. 17-22, 2012, pp. 1-3.
Avratoglou, C.P. et al., "Analysis and Design of a Generalized Class E Tuned Power Amplifier", In IEEE Transactions on Circuits and Systems, vol. 36, No. 8, Aug. 1989, pp. 1068-1079.
Balteanu, A. et al., "A 45-GHz, 2-bit Power DAC with 24.3 dBm Output Power, >14 Vpp Differential Swing, and 22% Peak PAE in 45-nm SOI CMOS", In Proceedings of IEEE Radio Frequency Integrated Circuits Symposium, Montreal, QC, CA, Jun. 17-19, 2012, pp. 319-322.
Balteanu, I. et al., "A 2-bit, 24 dBm, Millimeter-Wave SOI MCOS Power-DAC Cell for Watt-Level High-Efficiency, Fully Digital M-ary QAM Transmitters", In IEEE Journal of Solid-State Circuits, vol. 48, No. 5, May 2013, pp. 1126-1137.
Bhat, R. et al., "Large-Scale Power Combining and Mixed-Signal Linearizing Architectures for Watt-Class mmWave CMOS Power Amplifiers", In IEEE Transactions on Microwave Theory and Techniques, vol. 63, No. 2, Jan. 2015, pp. 703-718.

Bhat, R. et al., "Large-Scale Power-Combining and Linearization in Watt-Class mmWave CMOS Power Amplifiers", In Proceedings of IEEE Radio Frequency Integrated Circuits Symposium, Seattle, WA, US, Jun. 2-4, 2013, pp. 283-286.
Bohsali, M. and Niknejad, A.M., "Current Combining 60GHz CMOS Power Amplifiers", In Proceedings of IEEE Radio Frequency Integrated Circuits Symposium, Boston, MA, US, Jun. 7-9, 2009, pp. 31-34.
Chakrabarti, A. and Krishnaswamy, H., "Design Considerations for Stacked Class-E-like mmWave Power DACs in CMOS", In IEEE International Microwave Symposium Digest, Jun. 2-7, 2013, pp. 1-4.
Chakrabarti, A. and Krishnaswamy, H., "High Power, High Efficiency Stacked mmWave Class-E-like Power Amplifiers in 45nm SOI CMOS", In Proceedings of IEEE Custom International Circuits Conference, San Jose, CA, US, Sep. 9-12, 2012, pp. 1-4.
Chakrabarti, A. and Krishnaswamy, H., "High-Power, High-Efficiency, Class-E-like, Stacked mmWave PAs in SOI and Bulk CMOS: Theory and Implementation", In IEEE Transactions on Microwave Theory and Techniques, vol. 62, No. 8, Aug. 2014, pp. 1686-1704.
Chakrabarti, A. and Krishnaswamy, H., "Millimeter-Wave Digital Polar Phased Array Transmitter", Technical Report, Sep. 29, 2014, pp. 1-25.
Chakrabarti, A. et al., "Dual-Output Stacked Class-EE Power Amplifiers in 45nm SOI CMOS for Q-band Applications", In Proceedings of IEEE Compound Semiconductor Integrated Circuit Symposium (CSICS '12), La Jolla, CA, US, Oct. 14-17, 2012, pp. 1-4.
Chakrabarti, A., "An Improved Analysis and Design Methodology for RF Class-E Power Amplifiers with Finite DC-feed Inductance and Switch On-Resistance", In Proceedings of IEEE International Symposium on Circuits and Systems (ISCAS '12), Seoul, KR, May 20-23, 2012, pp. 1763-1766.
Chen, J. and Niknejad, A., "A Compact 1V 18.6dBm 60GHz Power Amplifier in 65nm CMOS", In Proceedings of the International Solid-State Circuits Conference Digest of Technical Papers (ISSCC '11), San Francisco, CA, US, Feb. 20-24, 2011, pp. 432-433.
Chen, J. et al., "A Digitally Modulated mm-Wave Cartesian Beamforming Transmitter with Quadrature Spatial Combining", In IEEE International Solid-State Circuits Conference Digest of Technical Papers (ISSCC '13), Feb. 17-21, 2013, pp. 232-233.
Chowdhury, D. et al., "A Fully Integrated Dual-Mode Highly Linear 2.4GHz CMOS Power Amplifier for 4G WiMax Applications", In IEEE Journal of Solid-State Circuits, vol. 44, No. 12, Dec. 2009, pp. 3393-3402.
Colomb, F. and Platzker, A., "A 3-Watt Q-band GaAs pHEMT Power Amplifier MMIC for High Temperature Operation", In IEEE International Microwave Symposium Digest, Jun. 2006, pp. 897-900.
Dabag, H. et al., "Analysis and Design of Stacked-FET Millimeter-Wave Power Amplifiers", In IEEE Transactions on Microwave Theory and Techniques, vol. 61, No. 4, Mar. 2013, pp. 1543-1556.
Datta, K. and Hashemi, H., "A 22.4 dBm Two-Way Wilkinson Power-Combined Q-Band SiGe Class-E Power Amplifier with 23% Peak PAE", In IEEE Compound Semiconductor Integrated Circuit Symposium, Oct. 14-17, 2012, pp. 1-4.
Datta, K. et al., "Analysis, Design and Implementation of mm-Wave SiGe Stacked Class-E Power Amplifiers", In IEEE Radio Frequency Integrated Circuits Symposium, Jun. 2-4, 2012, pp. 275-278.
Dickson, T. et al., "The Invariance of Characteristic Current Densities in Nanoscale MOSFETs and its Impact on Algorithmic Design Methodologies and Design Porting of Si(Ge) (Bi)CMOS High-Speed Building Blocks", In IEEE Journal of Solid-State Circuits, vol. 41, No. 8, Aug. 2006, pp. 1830-1845.
Ezzeddine, A. K. and Huang, H. C., "The High Voltage/High Power FET", In Proceedings of IEEE Radio Frequency Integrated Circuits Symposium, Jun. 8-10, 2003, pp. 215-218.
FCC, "Revision of Part 15 of the Commission's Rules Regarding Operation in the 57-64 GHz Band", Technical Report, Aug. 2013, pp. 1-2, available at: http://hraunfoss.fcc.gov/edocs_public/attachmatch/FCC-13-112A1.pdf.

(56) References Cited

OTHER PUBLICATIONS

Gogineni, U. et al., "RF Power Potential of 45 nm CMOS Technology", In Proceedings of the Tropical Meeting on Silicon Monolithic Integrated Circuits in RF Systems (SiRF '10), New Orleans, LA, US, Jan. 11-13, 2010, pp. 204-207.
Haldi, P. et al., "CMOS Compatible Transformer Power Combiner", In Electronics Letters, vol. 42, No. 19, Sep. 2006, pp. 1091-1092.
Hague, U. et al., "Combined RF and Multilevel PWM Switch Mode Power Amplifier", In Proceedings of IEEE NORCHIP, Vilnius, LT, Nov. 11-12, 2013, pp. 1-4.
Hasani, J.Y. and Kamerei, M., "Analysis and Optimum Design of a Class E RF Power Amplifier", In IEEE Transactions on Circuits and Systems (TCAS-1), vol. 55, No. 6, Jul. 2008, pp. 1759-1768.
Heydari, B. et al., "Millimeter-Wave Devices and Circuit Blocks up to 104GHz in 90nm CMOS", In IEEE Journal of Solid-State Circuits, vol. 42, No. 12, Dec. 2007, pp. 2893-2903.
ITU, "Recommendation P. 676: Attenuation by Atmospheric Gases", last updated Sep. 2013, pp. 1, available at: https://www.itu.int/rec/R-REC-P.676/en.
Johnson, E., "Physical Limitations on Frequency and Power Parameters of Transistors", In IRE International Convention Record, vol. 13, Mar. 1965, pp. 27-34.
Kalantari, N. and Buckwalter, J.F., "A 19.4dBm, Q-Band Class-E Power Amplifier in a 0.12um SiGe BiCMOS Process", In IEEE Microwave and Wireless Components Letters, vol. 20, No. 5, May 2010, pp. 283-285.
Kee, S., "The Class E/F Family of Harmonic-Tuned Switching Power Amplifiers", Ph.D. Dissertation, Department of Electrical Engineering, California Institute of Technology, Pasadena, CA, US, Dec. 2001, pp. 1-185, available at: http://resolver.caltech.edu/CaltechETD:etd-04262005-152703.
Kim, J.G. and Rebeiz, G., "Miniature Four-Way and Two-Way 24 GHz Wilkinson Power Dividers in 0.13 um CMOS", In IEEE Microwave and Wireless Components Letters, vol. 17, No. 9, Sep. 2007, pp. 658-660.
Ko, S. and Lin, J., "A Linearized Cascode CMOS Power Amplifier", In IEEE Wireless and Microwave Technical Conference, Dec. 4-5, 2006, pp. 1-4.
Krishnaswamy, H. and Hashemi, H., "Inductor and Transformer-Based Integrated RF Oscillators: A Comparative Study", In Proceedings of the IEEE Custom Integrated Circuits Conference (CICC '06), San Jose, CA, US, Sep. 10-13, 2006, pp. 381-384.
Lai, J. and Valdes-Garcia, V., "A 1V 17.9dBm 60GHz Power Amplifier in Standard 65nm CMOS", In Proceedings of the IEEE International Solid-State Circuits Conference Digest of Technical Papers (ISSCC '10), San Francisco, CA, US, Feb. 7-11, 2010, pp. 424-425.
Law, C.Y. and Pham, A.V., "A High Gain 60Ghz Power Amplifier with 20dBm Output Power in 90nm CMOS", In Proceedings of the IEEE International Solid-State Circuits Conference (ISSCC '10), San Francisco, CA, US, Feb. 7-11, 2010, pp. 426-427.
Lee, O. et al., "A Charging Acceleration Technique for Highly Efficient Cascode Class-E CMOS Power Amplifiers", In the IEEE Journal of Solid-State Circuits, vol. 45, No. 10, Oct. 2010, pp. 2184-2197.
Martineau, B. et al., "A 53-68 GHz 18 dBm Power Amplifier with an 8-Way Combiner in Standard 65 nm CMOS", In IEEE International Solid-State Circuits Conference Digest Technical Papers, Feb. 2010, pp. 428-429.
Mazzanti, A. et al., "Analysis of Reliability and Power Efficiency in Cascode Class-E PAs", In IEEE Journal of Solid-State Circuits, vol. 41, No. 5, May 2006, pp. 1222-1229.
McRory, J.G. et al., "Transformer Coupled Stacked FET Power Amplifiers", In IEEE Journal of Solid-State Circuits, vol. 34, No. 2, Feb. 1999, pp. 157-161.
Nicolson, S. et al., "A 1.2 V, 140 GHz Receiver with On-Die Antenna in 65 nm CMOS", In IEEE Radio Frequency Integrated Circuits Symposium, Jun. 2008, pp. 229-232.

Niknejad, A. et al., "Nanoscale CMOS for mm-Wave Applications", In IEEE Compound Semiconductor Integrated Circuits Symposium, Oct. 14-17, 2007, pp. 1-4.
Ogunnika, O.T. and Valdes-Garcia, A., "A 60GHz Class-E Tuned Power Amplifier with PAE >25% in 32nm SOI CMOS", In Proceedings of IEEE Radio Frequency Integrated Circuits Symposium (RFIC '12), Montreal, QC, CA, Jun. 17-19, 2012, pp. 65-68.
Pfeiffer, U. and Goern, D., "A 20 dBm Fully-Integrated 60GHz SiGe Power Amplifier with Automatic Level Control", In IEEE Journal of Solid-State Circuits, vol. 42, No. 7, Jul. 2007, pp. 1455-1463.
Pfeiffer, U.R. and Goren, D., "A 23-dBm 60-GHz Distributed Active Transformer in a Silicon Process Technology", In IEEE Transactions on Microwave Theory and Techniques, vol. 55, No. 5, May 2007, pp. 857-865.
Piazzon, L. et al., "New Generation of Multi-Step Doherty Amplifier", In Proceedings of IEEE European Microwave Integrated Circuits Conference, Manchester, UK, Oct. 10-11, 2011, pp. 116-119.
Pornpromlikit, S. et al., "A 33-dBm 1.9-GHz Silicon-on-Insulator CMOS Stacked-FET Power Amplifier", In IEEE Microwave Theory and Techniques Symposium Digest, Jun. 7-12, 2009, pp. 533-536.
Pornpromlikit, S. et al., "A Q-Band Amplifier Implemented with Stacked 45-nm CMOS FETs", In Proceedings of the IEEE Compound Semiconductor Integrated Circuit Symposium (CSICS '11), Waikoloa, HI, US, Oct. 16-19, 2011, pp. 1-4.
Reynaert, P. and Steyaert, M.S., "A 1.75GHz GSM/EDGE Polar Modulated CMOS RF Power Amplifier", In IEEE Journal of Solid-State Circuits, vol. 40, No. 12, Feb. 2005, pp. 2598-2608.
Sandstrom, D. et al., "94 GHz Power-Combining Power Amplifier with +13dBm Saturated Output Power in 65 nm CMOS", In IEEE Radio Frequency Integrated Circuits Symposium, Jun. 5-7, 2011, pp. 1-4.
Sarkas, I. et al., "A 45nm SOI CMOS Class-D mm-Wave PA with >10Vpp Differential Swing", In Proceedings of IEEE International Solid-State Circuits Conference, San Francisco, CA, US, Feb. 19-23, 2012, pp. 88-89.
Sengupta, K. et al., "On-Chip Sensing and Actuation Methods for Integrated Self-Healing mm-Wave CMOS Power Amplifier", In IEEE International Microwave Symposium, Jun. 17-22, 2012, pp. 1-3.
Sharma, J. and Krishnaswamy, H., "215GHz CMOS Signal Source Based on a Maximum-Gain Ring Oscillator Topology", In Proceedings of the IEEE International Microwave Symposium Digest (MTT '12), Jun. 17, 2012, pp. 1-3.
Shirinfar, F. et al., "A Fully Integrated 22.6dBm mm-Wave PA in 40nm CMOS", In Proceedings of IEEE Radio Frequency Integrated Circuits Symposium (RFIC), Seattle, WA, US, Jun. 2-4, 2013, pp. 279-282.
Siligaris, A. et al., "A 60 GHz Power Amplifier with 14.5 dBm Saturation Power and 25% Peak PAE in CMOS 65nm SOI", In IEEE Journal of Solid-State Circuits, vol. 45, No. 7, Jul. 2010, pp. 1286-1294.
Sokal, N.O. and Sokal, A.D., "Class E—A New Class of High-Efficiency Tuned Single-Ended Switching Power Amplifiers", In IEEE Journal of Solid-State Circuits, vol. 10, No. 3, Jun. 1975, pp. 168-176.
Tai, W. et al., "A 0.7W Fully Integrated 42GHz Power Amplifier with 10% PAE in 0.13m SiGe BiCOMS", In Proceedings of IEEE International Solid-State Circuits Conference, San Francisco, CA, US, Feb. 17-21, 2013, pp. 142-144.
U.S. Appl. No. 14/639,700, filed Mar. 5, 2015.
U.S. Appl. No. 61/948,198, filed Mar. 5, 2014.
Wang, C. et al., "Improved Design Technique of a Microwave Class-E Power Amplifier with Finite Switching-on Resistance", In Proceedings of IEEE RAWCON, Nov. 2003, pp. 241-244.
Wang, C., "CMOS Power Amplifiers for Wireless Communicaitons", Ph.D. Dissertation, California Institute of Technology, La Jolla, San Diego, CA, US, 2003, pp. 1-159.
Wang, H. et al., "Data Rate and Spectrum Requirements for IEEE 802.11 aj (45 GHz)", Sep. 27, 2012, pp. 1-19, available at: https://mentor.ieee.org/802.11/documents/.

(56) References Cited

OTHER PUBLICATIONS

Wang, H. et al., "MM-Wave Integration and Combinations", In IEEE Microwave Magazine, vol. 13, No. 5, Jul./Aug. 2012, pp. 49-57.

Wang, K. et al., "A 1V 19.3 dBm 79 GHz Power Amplifier in 65 nm CMOS", In IEEE International Solid-State Circuits Conference Digest of Technical Papers (ISSCC '12), San Francisco, CA, US, Feb. 19-23, 2012, pp. 260-262.

Wicks, B. et al., "A 60-GHz Fully-Integrated Doherty Power Amplifier Based on 0.13 µm CMOS Process", In IEEE Radio Frequency Integrated Circuits Symposium, Atlanta, GA, US, Jun. 15-17, 2008, pp. 69-72.

Xing, W. et al., "11aj 45GHz Link Budget for Use Cases Discussion", last updated Nov. 2012, pp. 1-10, available at: https://mentor.ieee.org/802.11/dcn/12/.

Xu, H. et al., "A Highly Linear 25 dBm Outphasing Power Amplifier in 32 nm CMOS for WLAN Application", In Proceedings of the 2010 European Solid-State Circuits Conference (ESSCIRC '10), Sevilla, ES, Sep. 14-16, 2010, pp. 306-309.

Yang, W. et al., "BSIMSOIv4.4 MOSFET Model User's Manual", BSIM Group, Department of Electrical Engineering and Computer Sciences, University of California, Berkeley, Dec. 2010, pp. 1-128.

Yue, C.P. and Wong, S. S., "On-Chip Spiral Inductors with Patterned Ground Shields for Si-Based RF ICs", In IEEE Journal of Solid-State Circuits, vol. 33, No. 5, May 1998, pp. 743-752.

Zhao, D. and Reynaert, P., "14.1 A 0.9 V 20.9 dBm 22.3%-PAE E-Band Power Amplifier with Broadband Parallel-Series Power Combiner in 40 nm CMOS", In IEEE International Solid-State Circuits Conference Digest Technical Papers, Feb. 2014, pp. 248-249.

Zhao, D. et al., "A 60 GHz Dual-Mode Power Amplifier with 17.4 dBm Output Power and 29.3% PAE in 40-nm CMOS", In Proceedings of IEEE European Solid-State Circuit Conference, Bodeaux, FR, Sep. 17-21, 2012, pp. 337-340.

Zhao, D. et al., "A 60GHz Outphasing Transmitter in 40nm CMOS with 15.6dBm Output Power", In Proceedings of IEEE International Solid-State Circuits Conference, San Francisco, CA, US, Feb. 19-23, 2012, pp. 170-172.

Zhao, Y. et al., "Compact Transformer Power Combiners for Millimeter-Wave Wireless Applications", In Proceedings of IEEE Radio Frequency Integrated Circuits Symposium, Anaheim, CA, US, May 23-25, 2010, pp. 223-226.

\* cited by examiner

The phase modulator can be controlled by phase control outputs $[P_{0,I}-P_{7,I}]$ and $[P_{0,Q}-P_{7,Q}]$ of digital interface 112.

Array driver 114 can receive the output of phase modulator 110 and provide a drive signal to digital polar transmitter elements 116, 118, 120, and 122 that is split evenly among the digital polar transmitter elements. Any suitable array driver can be used in some embodiments. For example, in some embodiments, the array driver described below in connection with FIG. 5 can be used.

Digital polar transmitter elements 116, 118, 120, and 122 can drive transmitter outputs 124, 126, 128, and 130 in response to the drive signal from array driver 114 and amplitude control outputs $[A_0-A_7]$ of digital interface 112. Each of transmitter outputs 124, 126, 128, and 130 can be connected to a suitable antenna. For example, in some embodiments, the antenna(s) can be phased array antennas, on-printed-circuit-board antennas, and/or any other suitable type of antenna. Any suitable number of digital polar transmitter elements can be used in some embodiments. For example, in some embodiments, four digital polar transmitter elements can be used to drive a 2×2 array of four antennas.

Figure 1:
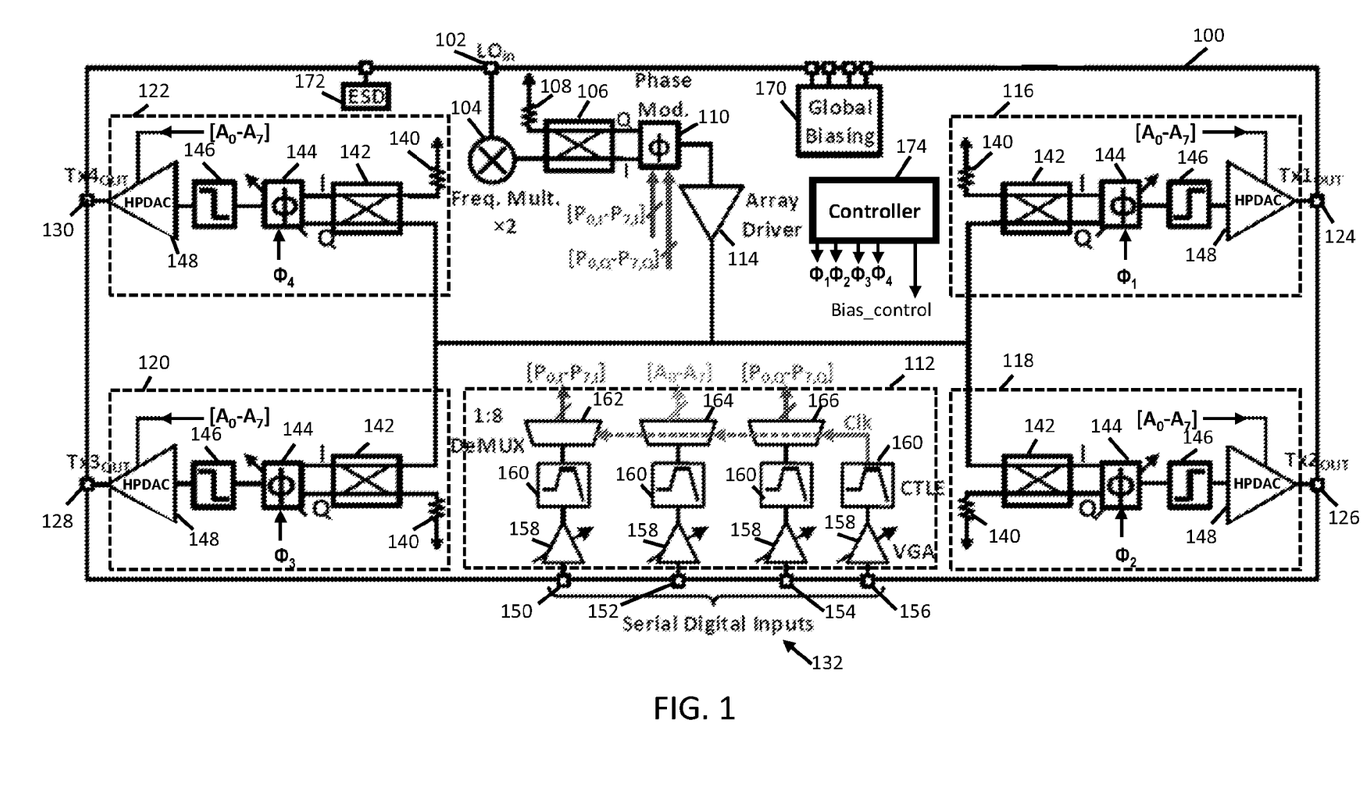

As further shown in FIG. 1, digital polar transmitter elements 116, 118, 120, and 122 can each include a resistor 140, a quadrature hybrid 142, a phase shifter 144, a limiting amplifier 146, and a hybrid power digital amplitude converter (DAC) 148.

The drive signal from array driver 114 can be provided to quadrature hybrid 142. The quadrature hybrid can be any suitable quadrature hybrid in accordance with some embodiments. As illustrated, resistor 140 can be connected from one of the inputs of the quadrature hybrid to ground to provide a reference impedance. Any suitable resistor can be used in some embodiments. For example, a 50 ohm resistor can be used.

In-phase and quadrature components of the drive signal from array driver 114 can be output by hybrid 142 to phase shifter 144. The phase shifter can be any suitable phase shifter, such as the phase modulator/shifter described below in connection with FIGS. 3 and 4. The phase shifter can be controlled by control signals $\phi1$, $\phi2$, $\phi3$, and $\phi4$ from a controller 174. These control signals can be used to control the phase of the signal to be transmitted by the digital polar transmitter element for any suitable purpose, such as for beamforming.

Controller can include any suitable hardware processor (e.g., a microprocessor, microcontroller, dedicated control logic, a digital signal processor, etc.), a scan chain, registers, memory, interfaces, inputs, outputs, etc. and can perform any suitable functions, such as controlling phase shifters 144, controlling bias functions, performing specialized processing for phased arrays, compensating for various implementation non-idealities that result in beam pointing error, etc.

The outputs of phase shifter 144 can be provided to limiting amplifier 146. The limiting amplifier can be any suitable limiting amplifier, such as the limiting amplifier described below in connection with FIG. 6.

The output of limiting amplifier 146 can be provided to hybrid power DAC 148. Hybrid power DAC 148 can be any suitable hybrid power DAC in some embodiments. For example, hybrid power DAC 148 can be implemented using the hybrid power DAC described below in connection with FIG. 7.

As shown in FIG. 1, digital interface 112 can include variable gain amplifiers (VGAs) 158, continuous time linear equalizers (CTLEs) 160, and demultiplexers 162, 164, and 166. Digital interface can receive digital serial inputs 132. More particularly, inputs 132 can include I phase control inputs, Q phase control inputs, amplitude control inputs, and a clock at inputs 150, 154, 152, and 156, respectively. Based on the inputs received at 132, the digital interface can generate phase control outputs $[P_{0,I}-P_{7,I}]$ and $[P_{0,Q}-P_{7,Q}]$ and amplitude control outputs $[A_0-A_7]$ from demultiplexers 162, 166, and 164, respectively.

Global biasing circuitry 170 can be provided, as known in the art, to generate biasing voltages in circuit 100 in accordance with some embodiments.

ESD circuitry 172 can be provided, as known in the art, to protect circuit 100 from electrostatic discharge and overvoltage conditions in accordance with some embodiments.

Figure 2:
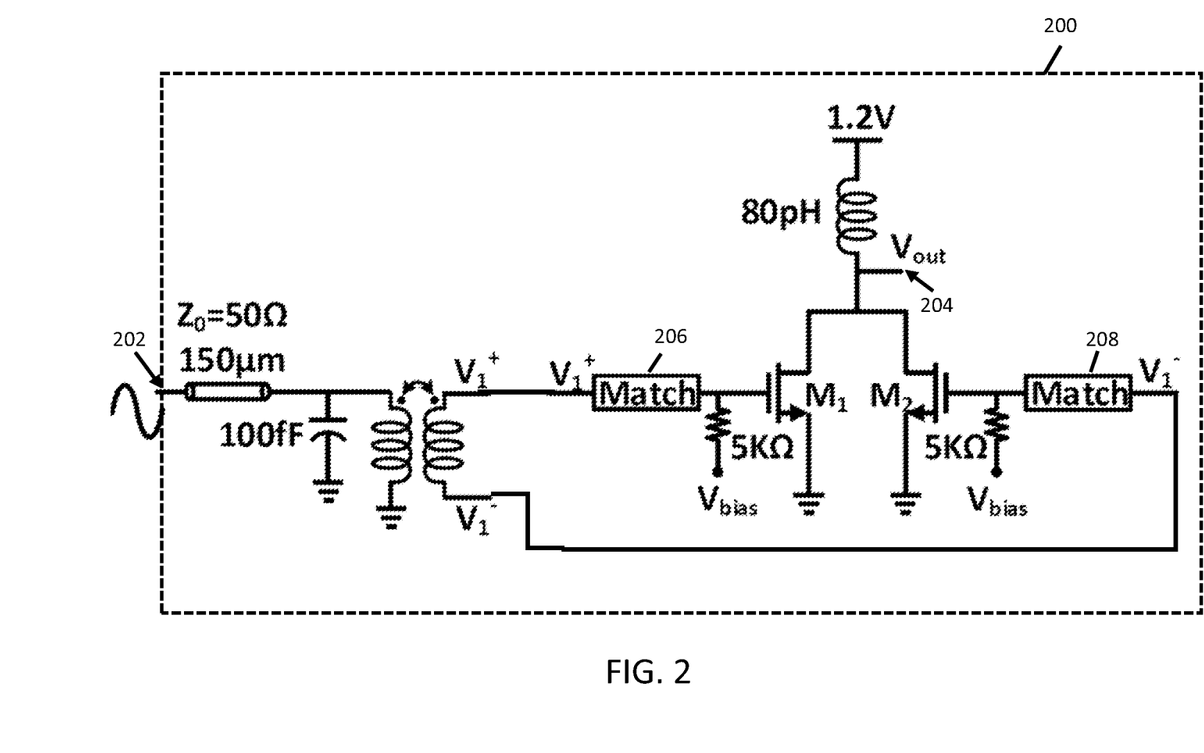

FIG. 2 shows an example 200 of a frequency multiplier that can be used to implement frequency multiplier 104 of FIG. 1 in some embodiments. As shown, a local oscillator reference signal can be received at node 202, the signal multiplied by two, and then the resulting signal output at node 204. In some embodiments, match blocks 206 and 208 can include any suitable components for matching the impedance of the points on the left and right of each match block. For example, in some embodiments, match blocks 206 and 208 can include inductors, spirals, transmission lines, and/or capacitors.

Figure 3:
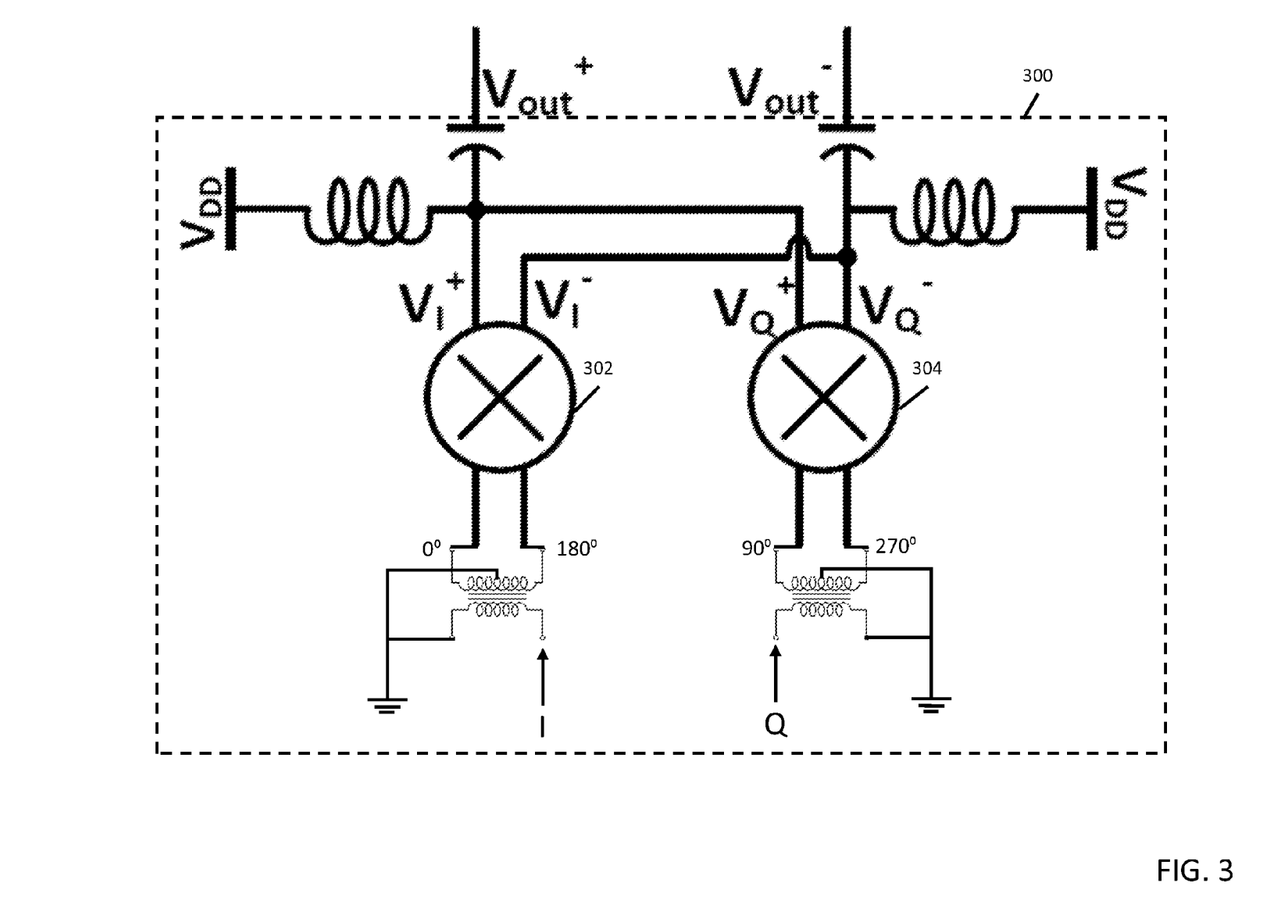

Turning to FIG. 3, an example 300 of a phase modulator/shifter that can be used as phase modulator 110 and/or phase shifter 144 of FIG. 1 in some embodiments. As shown, phase modulator/shifter 300 includes mixers 302 and 304. Any suitable mixers can be used as mixers 302 and 304. For example, in some embodiments, example mixer 400 described below in connection with FIG. 4 can be used as mixers 302 and/or 304.

Figure 4:
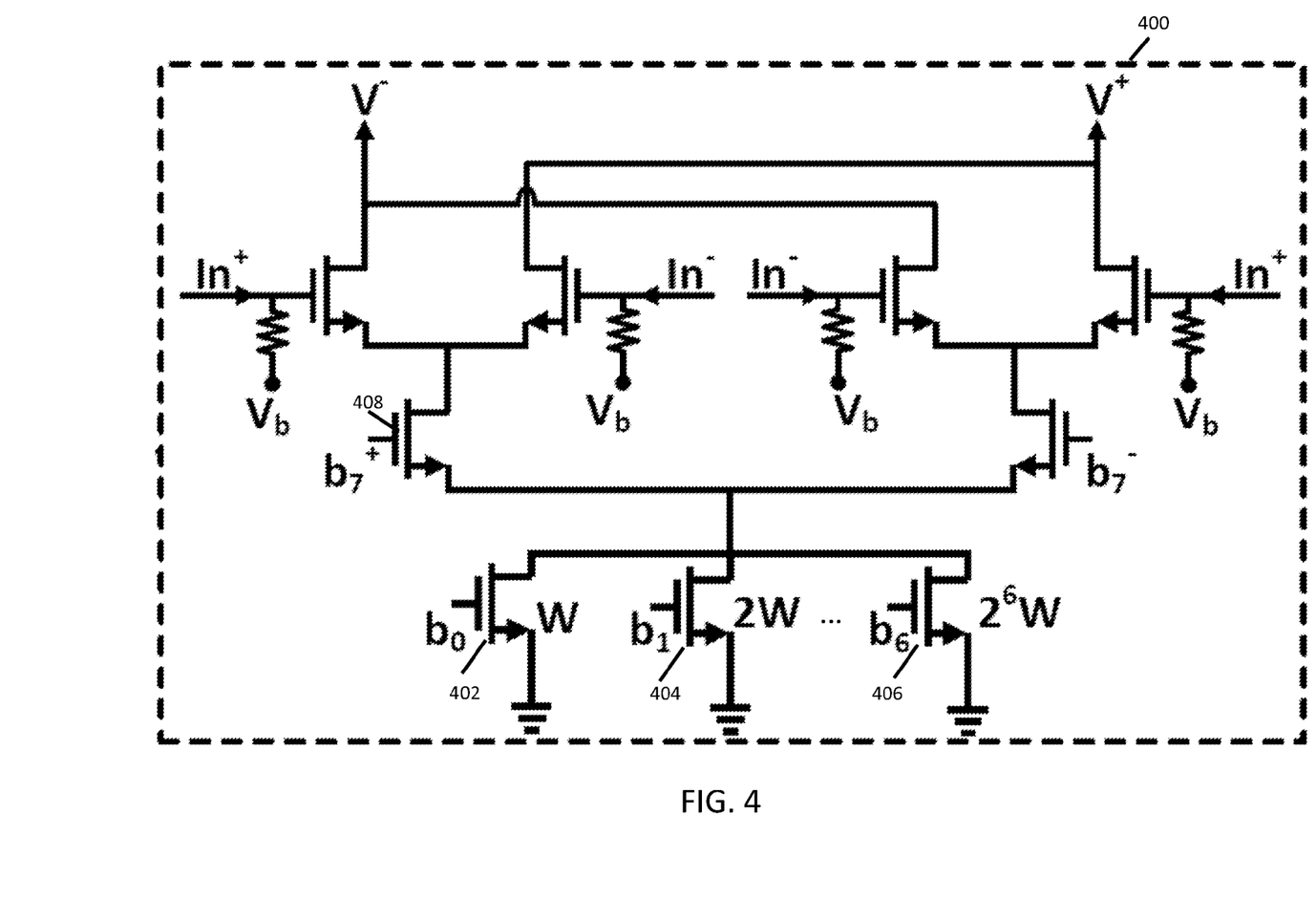

As shown in FIG. 4, mixer 400 includes eight switching transistors represented in this figure by transistors 402, 404, 406, and 408. The transistors other than transistor 408 (the most significant bit (MSB) transistor) are binary weighted with weights of W, 2W, . . . , $2^6$W, where W represents a given combination of finger width and number of fingers in a transistor. Any suitable combination of finger width and number of fingers can be used in the transistors for W, such as a finger width of 0.152 micron and one finger, in some embodiments.

The gates of these transistors are connected to inputs $b_0$, $b_1$, $b_2$, . . . , $b_7$. These bits can be provided by phase control bits $[P_{0,I}-P_{7,I}]$, $[P_{0,Q}-P_{7,Q}]$, $\phi1$, $\phi2$, $\phi3$, or $\phi4$ shown in FIG. 1 in some embodiments. The binary value that is provided to the inputs, determines the amount of modulation or shift of the input signal such that a higher value turns on a higher total weighting of switches, resulting in a higher current flow through the switches. Although eight transistors and inputs are shown, any suitable number of inputs and transistors can be used in some embodiments. A bias voltage, $V_b$, can also be provided to calibrate the shifter to account for variations in process, voltage, and temperature.

Figure 5:
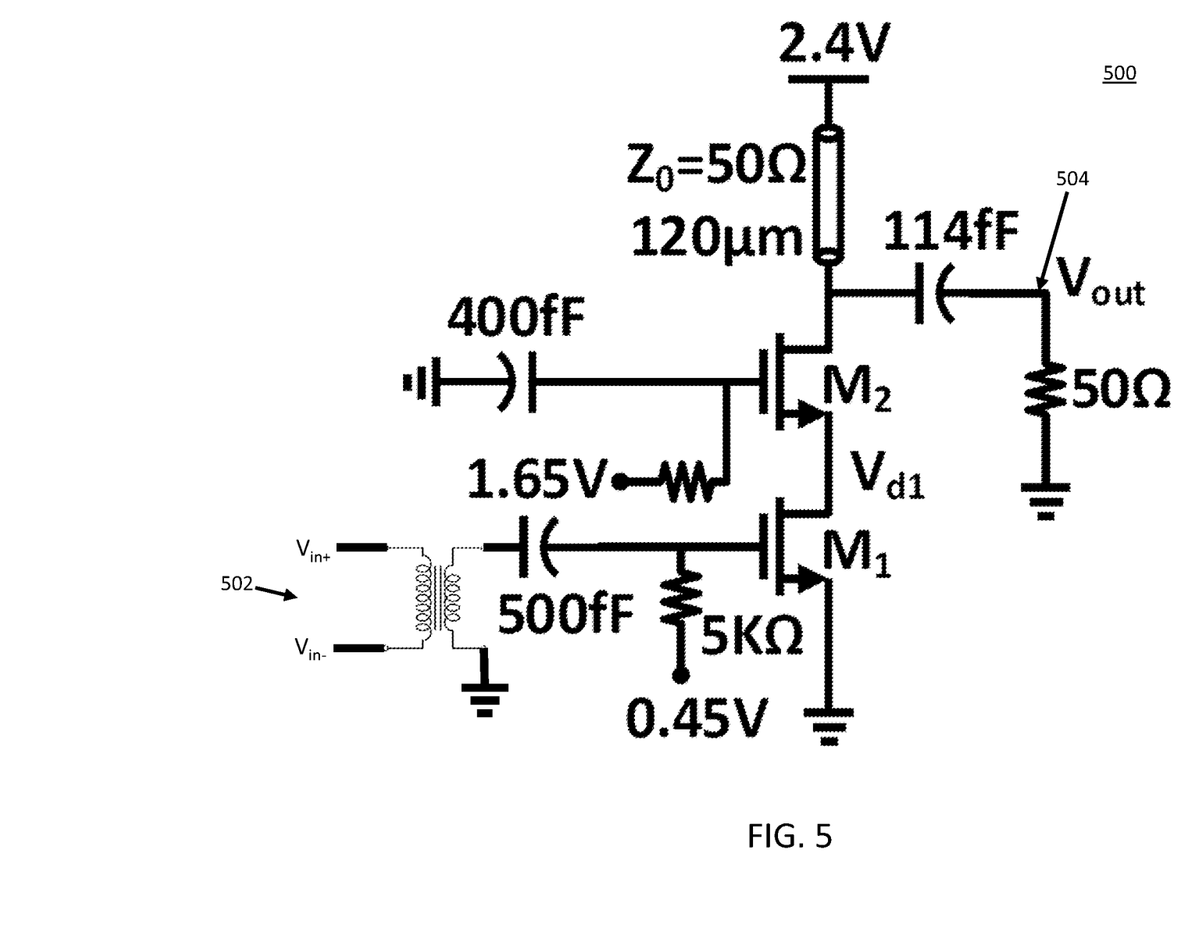

Turning to FIG. 5, an example 500 of an array driver that can be used to implement array driver 114 of FIG. 1 is shown in accordance with some embodiments. As shown, an input signal can be presented at inputs 502 of driver 500, the signal will be amplified, and the resulting signal will be provided at node 504.

Figure 6:
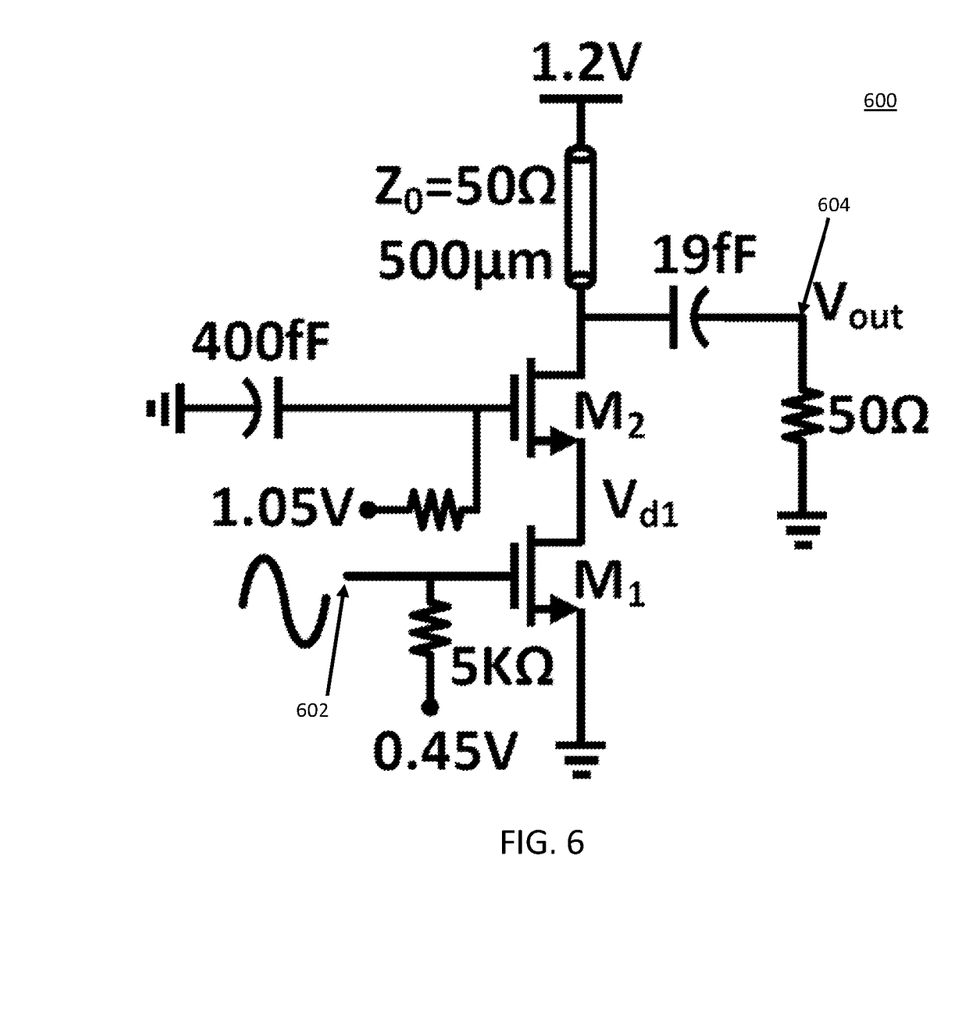

Turning to FIG. 6, an example 600 of a limiting amplifier that can be used to implement limiting amplifier 146 of FIG. 1 is shown in accordance with some embodiments. As shown, an input signal can be presented at node 602 of limiting amplifier 600, the signal will be amplified, and the resulting signal will be provided at node 604.

Figure 7:
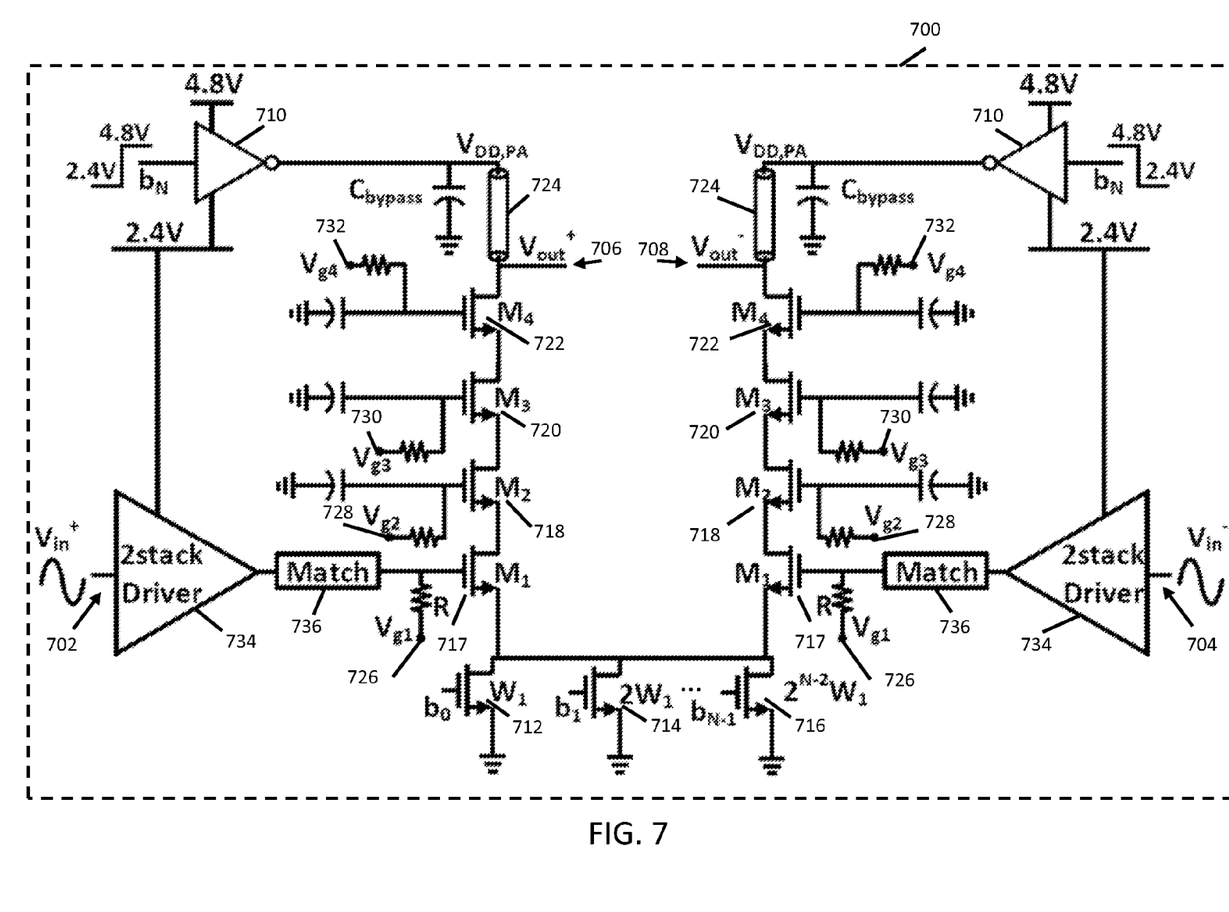

FIG. 7 shows an example 700 of a hybrid power DAC that can be used to implement hybrid power DAC 148 of FIG. 1 in accordance with some embodiments. As shown, in some embodiments, hybrid power DAC 700 can be implemented as a differential Class-E power amplifier with four stacked transistors that is augmented with tail transistors (at the common source node) and a supply inverter (connected to the differential DC-feed spiral of the four-stack Class E power amplifier) to incorporate amplitude modulation capability.

In some embodiments, hybrid power DAC 700 includes inputs 702 and 704, outputs 706 and 708, inverters 710, switching transistors 712, 714, and 716, stacked transistors 717, 718, 720, and 722, DC feed inductors (implemented as transmission lines) 724, gate bias inputs 726, 728, 730, and 732, two-stack drivers 734, and match blocks 736.

As shown in FIG. 7, hybrid power DAC 700 includes two inverters 710 and N−1 switching transistors, represented in this figure by transistors 712, 714, and 716. The N−1 switching transistors (represented by transistors 712, 714, and 716) are binary weighted with weights of $W_1$, $2W_1, \ldots, 2^{N-1}W_1$, where $W_1$ represents a given combination of finger width and number of fingers in a transistor. Any suitable combination of finger width and number of fingers can be used in the transistors for $W_1$, such as a finger width of 2.793 micron and two fingers, in some embodiments. The gates of the transistors are connected to inputs $b_0$, $b_1$, $b_2$, ..., $b_{N-1}$ and the input to the inverter is connected to input $b_N$ (the most significant bit (MSB)).

As suggested by the use of N in FIG. 7, any suitable number of switching transistors, and hence inputs $b_0 \ldots b_{N-1}$ can be used in some embodiments.

The binary value that is provided to inputs $b_0$, $b_1$, $b_2, \ldots, b_N$ determines the amount of amplification provided by the hybrid power DAC. These bits can be provided by amplitude control bits [$A_0$-$A_7$] shown in FIG. 1 in some embodiments. More particularly, a higher value at inputs $b_0$, $b_1$, $b_2, \ldots, b_{N-1}$ turns on a higher total weighting of the switching transistors, resulting in a higher current flow through the switching transistors, and the value of input $b_N$ at the input to inverter 710 determines the supply voltage $V_{DD,PA}$ supplied to the stack of transistors including stacked transistors 717, 718, 720, and 722 and the switching transistors.

Figure 10:
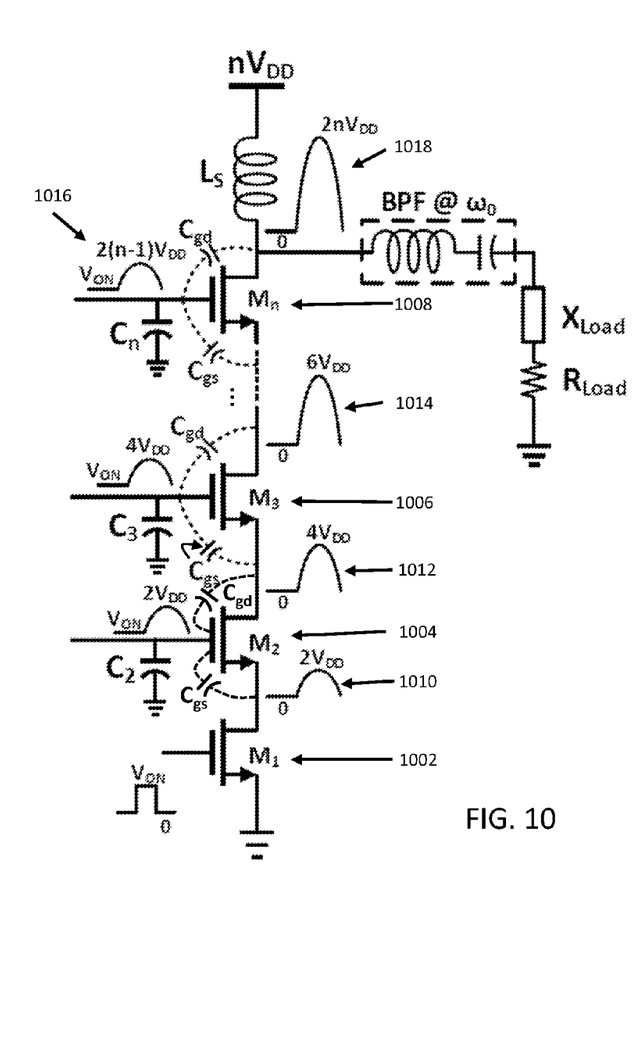

The manner in which this amplification is achieved is further illustrated in connection with FIG. 10. As shown, for a given input at the gate of transistor M1 1002, a voltage between ground and $2V_{DD}$ (represented by voltage 1010) (where, $V_{DD}$ here represents the nominal voltage supply in the technology used, for example, 1.2V nominally in 45 nm SOI CMOS) is produced at the source of transistor M2 1004. This results in a voltage between $V_{ON}$ and $2V_{DD}$ being present at the gate of transistor M2 1004 through capacitance Cgs between the source and the gate of transistor M2 1004 (which capacitance is inherently present in transistor M2 1004), resulting in a voltage between ground and $4V_{DD}$ (represented by voltage 1012) being produced at the source of transistor M3 1006. This results in a voltage between $V_{ON}$ and $4V_{DD}$ being present at the gate of transistor M3 1006 through capacitance Cgs between the source and the gate of transistor M3 1006, resulting in a voltage between ground and $6V_{DD}$ (represented by voltage 1014) being produced at the source of the transistor above transistor M3 1006. This process is repeated for the transistors going upward along the stack represented by transistors 1002, 1004, 1006, and 1008 until a voltage of between $V_{ON}$ and $2(n-1)V_{DD}$ (represented by voltage 1016) is produced at the gate of transistor $M_n$ 1008, which results in a voltage between ground and $2nV_{DD}$ being produced at the drain of transistor $M_n$ 1008 and the output of the stack.

As stated above, whether the output of the stack is at ground or 2nVDD depends on the input at the gate of transistor M1 1002. Referring back to FIG. 7, the corresponding inputs in the hybrid power DAC are at the gates of transistors M1 717. As shown, these inputs are controlled by the outputs of two-stack drivers 734, which are driven by inputs 702 and 704.

Figure 8:
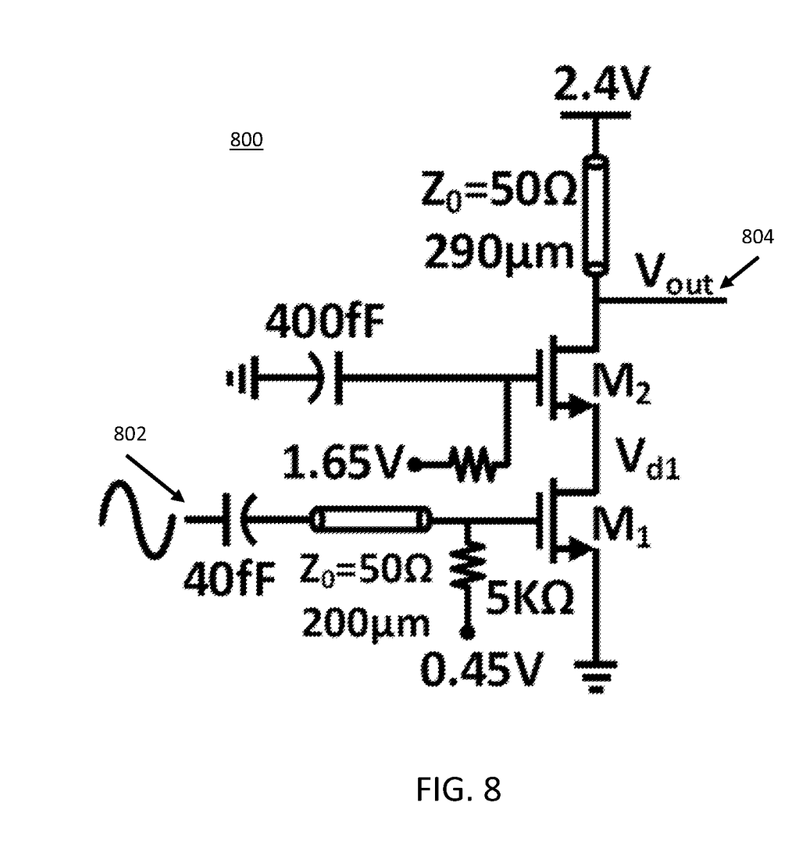

An example 800 of a two-stack driver that can be used for two-stack driver 734 in accordance with some embodiments is shown in FIG. 8. As shown, the input to the two-stack driver is provided at node 802 and the output is produced at node 804.

As shown in FIG. 7, the outputs of two-stack drivers 734 are connected to the gates of transistors M1 717 by match blocks 736. In some embodiments, match blocks 736 can include any suitable components for matching the impedance of the points on the left and right of each match block. For example, in some embodiments, match blocks 736 can include inductors, spirals, transmission lines, and/or capacitors.

As also shown in FIG. 7, the gates of transistors M1 717, M2 718, M3 720, and M4 722 are biased by bias voltages $V_{g1}$, $V_{g2}$, $V_{g3}$, and $V_{g4}$. These bias voltages can be produced in any suitable manner. For example, in some embodiments, for each hybrid power DAC 700, an adaptive bias circuit, such as adaptive bias circuit 900 shown in FIG. 9, can be provided.

Figure 9:
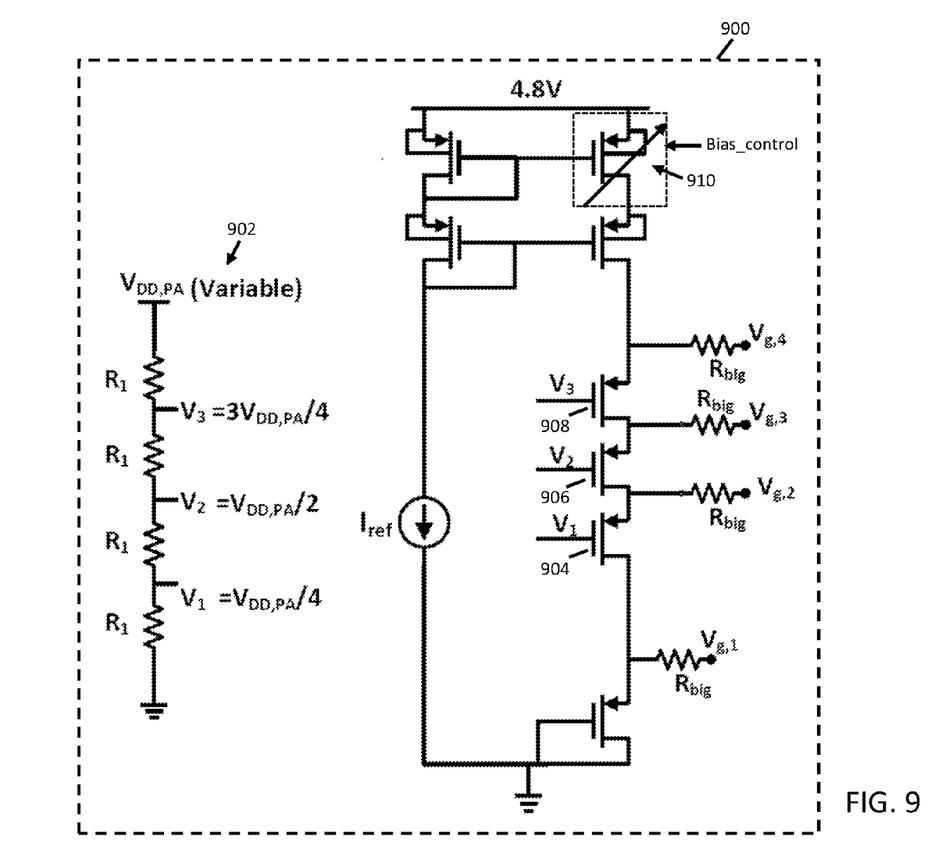

As illustrated in FIG. 9, circuit 900 includes a voltage divider 902 formed from four resistors $R_1$. These resistors can have any suitable value. The voltage divider is powered by $V_{DD,PA}$, which as described in FIG. 7 is variable and controlled by the output of inverters 710. Voltages V1, V2, and V3 shown in FIG. 9 are provided to transistors 904, 906, and 908, respectively. The bias voltages are then produced at the nodes labelled $V_{g1}$, $V_{g2}$, $V_{g3}$, and $V_{g4}$.

Resistors $R_{big}$ can have any suitable values sufficiently large compared to the gate impedance (of the gates connected to the corresponding bias voltage) to have suitable performance but not too large so as to affect modulation speed. In some embodiments, $R_{big}$ can be a 1 kΩ resistor.

In some embodiments, transistor 910 can be implemented as a bank of parallel binary weighted transistors (e.g., like the binary weighted transistors described above in connection with FIGS. 4 and 7) so that the bias voltages produced by circuit 900 can be controlled by controller 174 of FIG. 1. In some of these embodiments, any suitable number of parallel binary weighted transistors can be provided, and each of the transistors can have any suitable weighting(s). When such control is not needed, transistor 910 can be a single transistor.

Although specific components having specific properties (e.g., resistances, capacitance, sizes, relative sizes, voltages, etc.) are shown in FIGS. 1-10, one or more of the components in any one or more of these figures can be omitted or substituted with one or more alternate components having one or more different properties, in some embodiments.

The provision of the examples described herein (as well as clauses phrased as "such as," "e.g.," "including," and the like) should not be interpreted as limiting the claimed subject matter to the specific examples; rather, the examples are intended to illustrate only some of many possible aspects.

Although the invention has been described and illustrated in the foregoing illustrative embodiments, it is understood that the present disclosure has been made only by way of example, and the numerous changes in the details of implementation of the invention can be made without departing from the spirit and scope of the invention, which is only limited by the claims which follow. Features of the disclosed embodiments can be combined and rearranged in various ways.

What is claimed is:

1. A circuit for a transmitter, comprising:
at least one digital-to-amplitude converter (DAC) each having an input and an output, each comprising:
  a plurality of binary weighted switching transistors, each having a gate coupled to one of a plurality of control bits, a drain, and a source, wherein the drains of the plurality of binary weighted switching transistors are connected together and wherein the sources of the plurality of binary weighted switching transistors are connected to ground;
  a first transistor having a gate coupled to an input signal from the input and a first bias voltage, a source coupled to the drains of the plurality of binary weighted switching transistors, and a drain;
  a second transistor having a gate coupled to a second bias voltage, a source coupled to the drain of the first transistor, and a drain;
  a third transistor having a gate coupled to a third bias voltage, a source coupled to the drain of the second transistor, and a drain;
  a fourth transistor having a gate coupled to a fourth bias voltage, a source coupled to the drain of the third transistor, and a drain coupled to the output of the DAC;
  an inductor having a first side coupled to the drain of the fourth transistor and having a second side; and
  a capacitor having a first side connected to ground and having a second side coupled to the second side of the inductor and to a voltage that is controlled by another control bit;
  and for each of the at least one DAC, an antenna coupled to the output of the DAC.

2. The circuit of claim 1, further comprising:
a first variable gain amplifier (VGA) that receives a first digital input and that provides a first VGA output;
a first continuous time linear equalizer (CTLE) that receives the first VGA output and that produces a first CTLE output; and
a demultiplexer that receives the first CTLE output and a clock signal and that produces the plurality of control bits and the another control bit.

3. The circuit of claim 2, further comprising:
a second VGA that receives a second digital input and that provides a second VGA output; and
a second CTLE that receives the second VGA output and that produces the clock signal.

4. The circuit of claim 1, further comprising a bias voltage generator comprising:
a voltage divider formed from four equally sized, serial resistors that produces a first voltage, a second voltage, a third voltage, and a fourth voltage;
a first transistor having a gate and a drain connected to ground and having a source;
a second transistor having a gate connected to the first voltage, a drain coupled to a first bias voltage output and the source of the first transistor, and a source;
a third transistor having a gate connected to the second voltage, a drain coupled to a second bias voltage output and the source of the second transistor, and a source; and
a fourth transistor having a gate connected to the third voltage, a drain coupled to a third bias voltage output and the source of the third transistor, and a source coupled to a fourth bias voltage output and a current source.

5. The circuit of claim 4, wherein the current source is variable.

6. The circuit of claim 4, wherein the first bias voltage output, the second bias voltage output, the third bias voltage output, and the fourth bias voltage output provide the first bias voltage, the second bias voltage, the third bias voltage, and the fourth bias voltage, respectively.

7. The circuit of claim 1, wherein the at least one DAC includes a plurality of DACs and each of the plurality of DACs is part of a digital polar transmitter element that also comprises a quadrature hybrid, a phase shifter, and a limiting amplifier, wherein a drive signal drives the quadrature hybrid, the quadrature hybrid outputs an in-phase signal and a quadrature signal, the phase shifter receives the in-phase signal and the quadrature signal and provides an output signal that is shifted according to one of a plurality of phase signals, and the limiting amplifier receives the output signal from the phase shifter and outputs the input signal to the DAC, and wherein a scan chain provides the plurality of phase signals.

8. A circuit for a transmitter, comprising:
at least one digital-to-amplitude converter (DAC) each having an input and an output, each comprising:
  a plurality of binary weighted switching transistors, each having a gate coupled to one of a plurality of control bits, a drain, and a source, wherein the drains of the plurality of binary weighted switching transistors are connected together and wherein the sources of the plurality of binary weighted switching transistors are connected to ground;
  a first transistor having a gate coupled to an input signal from the input and a first bias voltage, a source coupled to the drains of the plurality of binary weighted switching transistors, and a drain;
  a second transistor having a gate coupled to a second bias voltage, a source coupled to the drain of the first transistor, and a drain;
  a third transistor having a gate coupled to a third bias voltage, a source coupled to the drain of the second transistor, and a drain;
  a fourth transistor having a gate coupled to a fourth bias voltage, a source coupled to the drain of the third transistor, and a drain coupled to the output of the DAC;
  a transmission line having a first side coupled to the drain of the fourth transistor and having a second side; and
  a capacitor having a first side connected to ground and having a second side coupled to the second side of the transmission line and to a voltage that is controlled by another control bit; and
for each of the at least one DAC, an antenna coupled to the output of the DAC.

9. The circuit of claim 8, further comprising:
a first variable gain amplifier (VGA) that receives an a first digital input and that provides a first VGA output;

a first continuous time linear equalizer (CTLE) that receives the first VGA output and that produces a first CTLE output; and a demultiplexer that receives the first CTLE output and a clock signal and that produces the plurality of control bits and the another control bit.

10. The circuit of claim 9, further comprising:

a second VGA that receives a second digital input and that provides a second VGA output; and a second CTLE that receives the second VGA output and that produces the clock signal.

11. The circuit of claim 8, further comprising a bias voltage generator comprising:

a voltage divider formed from four equally sized, serial resistors that produces a first voltage, a second voltage, a third voltage, and a fourth voltage;

a first transistor having a gate and a drain connected to ground and having a source;

a second transistor having a gate connected to the first voltage, a drain coupled to a first bias voltage output and the source of the first transistor, and a source;

a third transistor having a gate connected to the second voltage, a drain coupled to a second bias voltage output and the source of the second transistor, and a source; and a fourth transistor having a gate connected to the third voltage, a drain coupled to a third bias voltage output and the source of the third transistor, and a source coupled to a fourth bias voltage output and a current source.

12. The circuit of claim 11, wherein the current source is variable.

13. The circuit of claim 11, wherein the first bias voltage output, the second bias voltage output, the third bias voltage output, and the fourth bias voltage output provide the first bias voltage, the second bias voltage, the third bias voltage, and the fourth bias voltage, respectively.

14. The circuit of claim 8, wherein the at least one DAC includes a plurality of DACs and each of the plurality of DACs is part of a digital polar transmitter element that also comprises a quadrature hybrid, a phase shifter, and a limiting amplifier, wherein a drive signal drives the quadrature hybrid, the quadrature hybrid outputs an in-phase signal and a quadrature signal, the phase shifter receives the in-phase signal and the quadrature signal and provides an output signal that is shifted according to one of a plurality of phase signals, and the limiting amplifier receives the output signal from the phase shifter and outputs the input signal to the DAC, and wherein a scan chain provides the plurality of phase signals.

* * * * *